United States Patent
Kawabe et al.

(10) Patent No.: US 7,474,244 B2
(45) Date of Patent: Jan. 6, 2009

(54) CURRENT ADDITION TYPE DIGITAL ANALOG CONVERTER

(75) Inventors: Akira Kawabe, Osaka (JP); Akio Yokoyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/889,129

(22) Filed: Aug. 9, 2007

(65) Prior Publication Data

US 2008/0036637 A1 Feb. 14, 2008

(30) Foreign Application Priority Data

Aug. 10, 2006 (JP) ............... 2006-218081

(51) Int. Cl.
*H03M 1/66* (2006.01)
(52) U.S. Cl. .................... 341/144; 341/120
(58) Field of Classification Search ............... 341/144, 341/145, 118, 120
See application file for complete search history.

(56) References Cited

U.S. PATENT DOCUMENTS 4,990,916 A * 2/1991 Wynne et al. ............ 341/147
6,469,647 B1 10/2002 Kinugasa et al.
6,917,316 B2 * 7/2005 Blackburn .................. 341/118
7,173,553 B2 2/2007 Ohmi et al.
7,173,554 B2 * 2/2007 Tucholski .................. 341/150

FOREIGN PATENT DOCUMENTS

| JP | 2002-076892 | 3/2002 |
| JP | 2003-338759 | 11/2003 |
| JP | 2007-266872 | 10/2007 |
| JP | 2008-028604 | 2/2008 |

* cited by examiner

*Primary Examiner*—Brian Young
(74) *Attorney, Agent, or Firm*—McDermott Will & Emery LLP

(57) ABSTRACT

A digital analog converter includes a current conversion section and a voltage conversion section. The current conversion section has a first output terminal and a second output terminal. The first output terminal outputs a first current and a second output terminal outputs a second current, the first current varying in value according to inputted digital data, the sum of the first current and the second current becoming a constant current. The voltage conversion section converts the first current to a corresponding first voltage and produces an offset voltage on the basis of the constant current and outputs the sum of the first voltage and the offset voltage as an output voltage.

14 Claims, 6 Drawing Sheets

CURRENT ADDITION TYPE DIGITAL ANALOG CONVERTER

CROSS-REFERENCE TO RELATED APPLICATIONS

The contents disclosed in the claims, specification, and drawings of Japanese Patent Application No. 2006-218081 filed on Aug. 10, 2006 are hereby incorporated by reference into this application.

BACKGROUND OF THE INVENTION

1. Technical Field

The present invention relates to a current addition type digital analog converter and in particular to a digital analog converter having an interface circuit with a subsequent circuit.

2. Related Art

FIG. 8 shows the configuration of a general current addition type digital analog converter (DAC). As shown in FIG. 8, a usual current addition type DAC has a current conversion section 101 for converting inputted digital data to a corresponding output current and a voltage conversion section 102 for converting the output current of the current conversion section 101 to voltage.

The current conversion section 101 includes a reference power source, a plurality of current source circuits connected to the reference power source, and a switching part controlled by inputted digital data. Current is divided for output by the switching part into a first output terminal (output terminal for conversion) 114 and a second output terminal (output terminal for waste) 115.

As for the voltage conversion section 102, in the simplest configuration, it suffices to have a resistance element 121 connected between the first output terminal 114 and the ground and to convert current I+ outputted from the first output terminal 114 to voltage. However, in this case, the bottom of the output voltage becomes 0 V, which causes mismatching with an input range of a subsequent circuit connected subsequently to the DAC. For this reason, there is provided an offset voltage producing circuit composed of a resistance element 122 and a constant current source 123 to match the range of the output voltage with the input range of the subsequent circuit. On the other hand, current I− outputted from the second output terminal 115 is wasted to the ground via a resistance element 125.

However, when the offset voltage producing circuit like this is provided, the following problem will be presented. First, since an offset voltage is produced by the use of the constant current source and the resistance element, the consumption current of the DAC will be increased. Further, the footprint of the interface circuit will be also increased. Still further, since the output voltage is varied by variations in the constant current source and the resistance element, it is necessary to use an element of high accuracy and to make a cut-and-try adjustment.

Moreover, although there is a case where current (waste current) outputted from the second output terminal is utilized for the purpose of improving the frequency characteristics of the DAC, as disclosed in Japanese Unexamined Patent Publication No. 2003-338759, the current is usually wasted without being utilized. In this manner, a sufficient study has never been made so as to reduce consumption current in the conventional DAC.

SUMMARY OF THE INVENTION

The object of the present invention is to solve the foregoing problems in the related art and to realize a digital analog converter having consumption current and a circuit footprint reduced.

To achieve this object, according to the present invention, a digital analog converter employs a configuration of producing an offset voltage on the basis of the sum of a current for output and a current for waste.

Specifically, a digital analog converter according to the present invention includes: a current conversion section having a first output terminal for outputting a first current and a second output terminal for outputting a second current, the first current varying in value according to inputted digital data, a sum of the first current and the second current being a constant current; and a voltage conversion section for converting the first current to a corresponding first voltage and for producing an offset voltage on the basis of the constant current and outputs a sum of the first voltage and the offset voltage as an output voltage.

The digital analog converter of the present invention produces the offset voltage by the use of the constant current which is the sum of the first current and the second current. For this reason, a current source for producing the offset voltage does not need to be provided separately. Thus, the consumption current of the digital analog converter is hardly increased as compared with a conventional digital analog converter. Moreover, the area of the circuit is hardly increased, either.

It suffices for the voltage conversion section to include, for example, a first resistance element connected between the first output terminal and the second output terminal and a second resistance element connected between the second output terminal and the ground.

DESCRIPTION OF THE PREFERRED EMBODIMENTS

Figure 1:
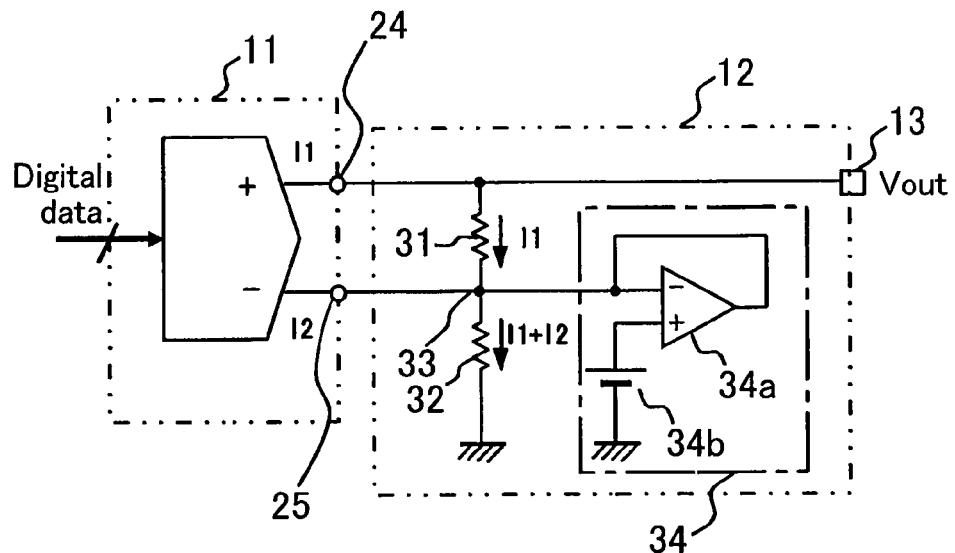
FIG. 1 is a circuit diagram showing a digital analog converter according to one embodiment of the present invention.

One embodiment of the present invention will be specifically described below with reference to the drawings. FIG. 1 shows a circuit configuration of a digital analog converter (DAC) according to one embodiment of the present invention. As shown in FIG. 1, the DAC includes: a current conversion section 11 for converting digital data to a corresponding current value and for outputting the current value; and a voltage conversion section 12 for converting the output current of the current conversion section to voltage.

Figure 2:
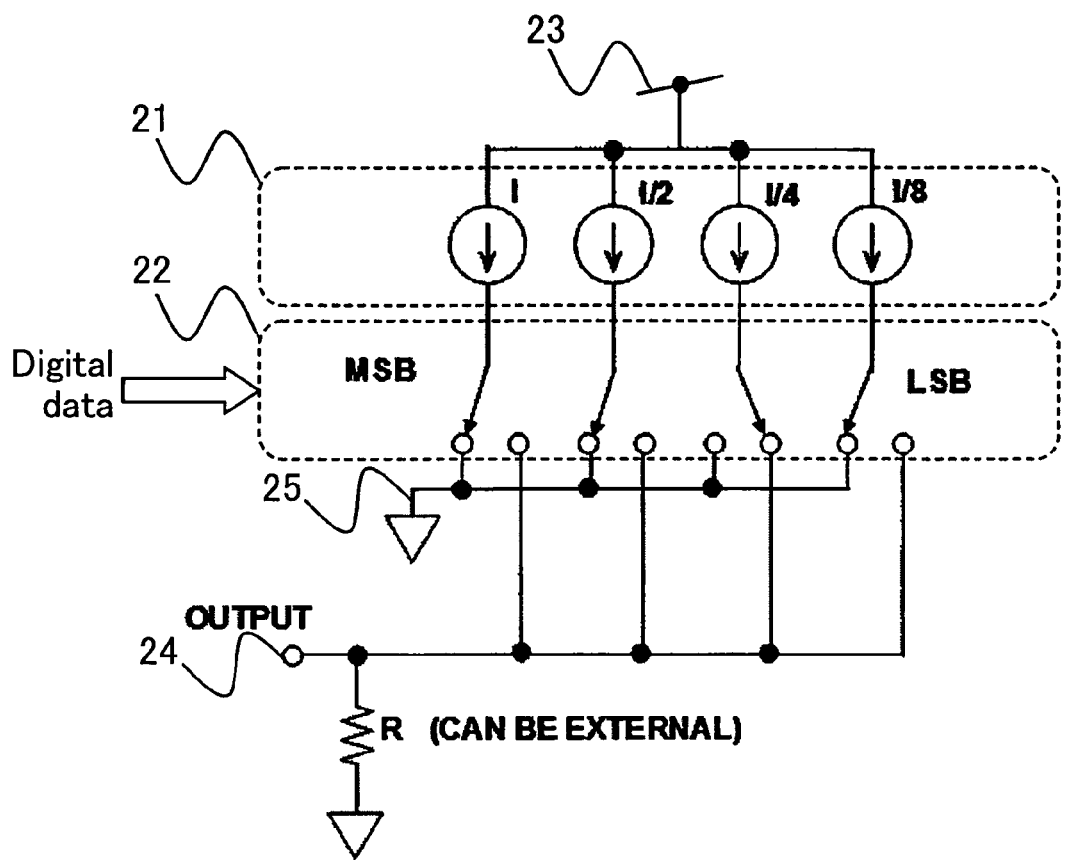
FIG. 2 is a circuit diagram showing an example of a current conversion section of the digital analog converter according to the one embodiment of the present invention.

The current conversion section 11 is a digital data-current conversion section of a general current addition type DAC, and includes, for example, a current source circuit 21 and a switch circuit 22 as shown in FIG. 2, the current source circuit 21 outputting a reference current I and currents I/2, I/4, and I/8 that are obtained by assigning weights to the reference current I. A reference numeral 23 denotes a reference power source. The switch circuit 22 divides the output of the current source circuit 21 into a first output terminal 24 and a second output terminal 25 according to the digital data inputted to the current conversion section 11. For this reason, the value of a first current (current for conversion) I1 outputted from the first output terminal 24 is varied according to the inputted digital data. Moreover, the sum of the first current I1 and a second current (current for waste) I2 outputted from the second output terminal 25 are constant.

The voltage conversion section 12 includes: a first resistance element 31 connected between the first output terminal 24 and the second output terminal 25; a second resistance element 32 connected between the second output terminal 25 and the ground; and a voltage holding circuit 34 connected to a connection node 33 of the first resistance element 31 and the second resistance element 32. The voltage holding circuit 34 includes a differential amplifier 34a and a reference voltage source 34b, the differential amplifier 34a having an output terminal connected to a minus side input terminal and having the minus side input terminal connected to the connection node 33, the reference voltage source 34b being connected to a plus side input terminal of the differential amplifier 34a.

The first current I1 flows through the first resistance element 31 and is converted to a first voltage V1 corresponding to the digital data. The constant current of the sum of the first current I1 and the second current I2 flows through the second resistance element 32 and hence a constant offset voltage Vf is produced. With this, an output voltage Vout of the sum of the first voltage V1 and the constant offset voltage Vf is outputted from an output terminal 13.

Figure 3:
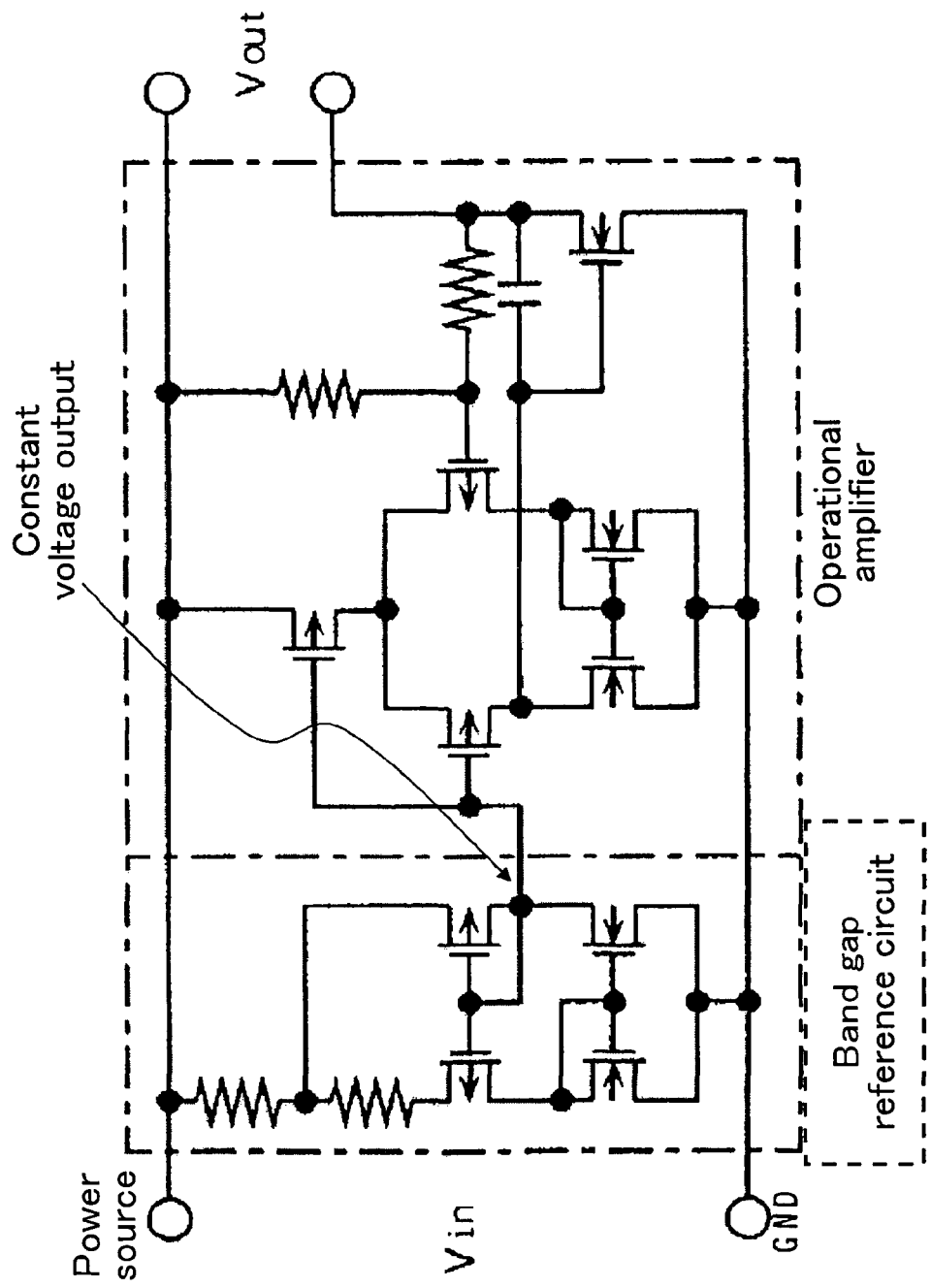
FIG. 3 is a circuit diagram showing an example of a reference voltage source used for the digital analog converter according to the one embodiment of the present invention.

Moreover, the voltage holding circuit 34 is connected to the connection node 33. Thus, this can compensate variations in the offset voltage Vf caused by variations in the resistance element. Here, the reference voltage source 34b may be any circuit, if the source can produce a constant reference voltage. It suffices to employ, for example, a band gap reference circuit shown in FIG. 3 as the reference voltage source 34b. Moreover, the reference voltage source 34b may be built in the circuit or may be integrated externally. It suffices to match the voltage of reference voltage source 34b with the offset voltage Vf.

Figure 4:
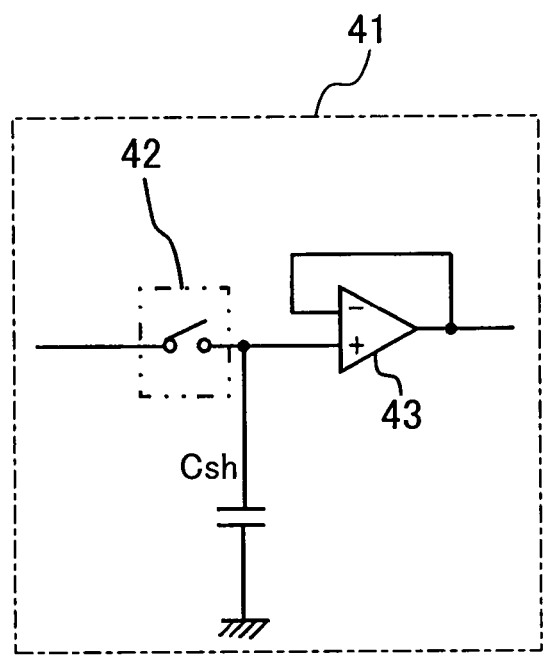
FIG. 4 is a circuit diagram showing an example of a circuit connected subsequently to the digital analog converter according to the one embodiment of the present invention.

In the DAC of this embodiment, the constant offset voltage Vf is added to the output voltage Vout. Thus, when the subsequent circuit receiving the output of the DAC is a sample holding circuit 41 as shown in FIG. 4, the range of the output voltage Vout can made to coincide with the input range of a switching circuit 42 or a buffer circuit 43, which is a constituent element of the sample holding circuit 41. As a result, it is possible to prevent a distortion of signal from being caused by the mismatching of the input range. Moreover, the offset voltage Vf is produced by the output current of the current conversion section 11, in other words, the sum of the first current I1 and the second current I2. For this reason, a current source for producing the offset voltage Vf does not need to be provided separately and hence the consumption current of the DAC is not increased. Moreover, the footprint of the DAC is not increased by the current source, either.

The voltage holding circuit 34 may be any circuit if the circuit can hold the voltage of the connection node 33 constant. For example, the voltage holding circuit 34 may be simply only a capacitance element connected between the connection node 33 and the ground. Moreover, if the DAC circuit does not have any problem in response speed and accuracy, the DAC does not need to be provided with the voltage holding circuit.

Figure 5:
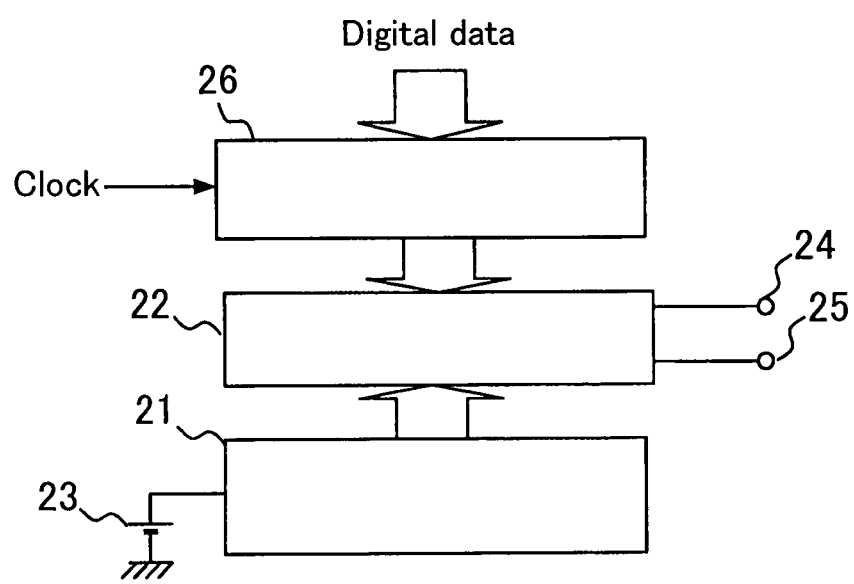
FIG. 5 is a circuit diagram showing a modification of the current conversion section of the digital analog converter according to the one embodiment of the present invention.

The current conversion section 11 may have a latch circuit 26 operating in synchronization with a clock signal, as shown in FIG. 5. With this, the inputting of the digital data can be synchronized with the clock signal. With this, when a major code in which all bits are changed (01111→100000) is inputted, it is possible to prevent a glitch caused by the wiring delay of each bit. Moreover, it is possible to operate the DAC in cooperation with the other circuit in terms of system by synchronizing the inputting of the digital data with the clock signal.

It suffices to determine the resistance values of the first resistance element 31 and the second resistance element 32 according to the input range of the subsequent circuit receiving the output of the DAC and the magnitude of the output current of the current conversion section 11. For example, these resistance values can be optimized by setting them in the following manner.

First, the resistance value of the second resistance element 32 is set in such a way as to match the offset voltage Vf with the lower operating range (for example, 0.3 V to 1.3 V) of a circuit subsequently connected. The offset voltage Vf becomes voltage (V=R×I) as the product of the second resistance element 32 and the sum of the first current I1 and the second current I2.

Next, the resistance value of the first resistance element 31 is set in such a way as to make the maximum value of the output voltage Vout not affect the operation of the current source in the current conversion section 11. This is because when the resistance value of the first resistance element 31 is made large, the developed voltage can be made large but an output node potential of the current source becomes high and hence the current conversion section 11 does not operate.

Figure 6:
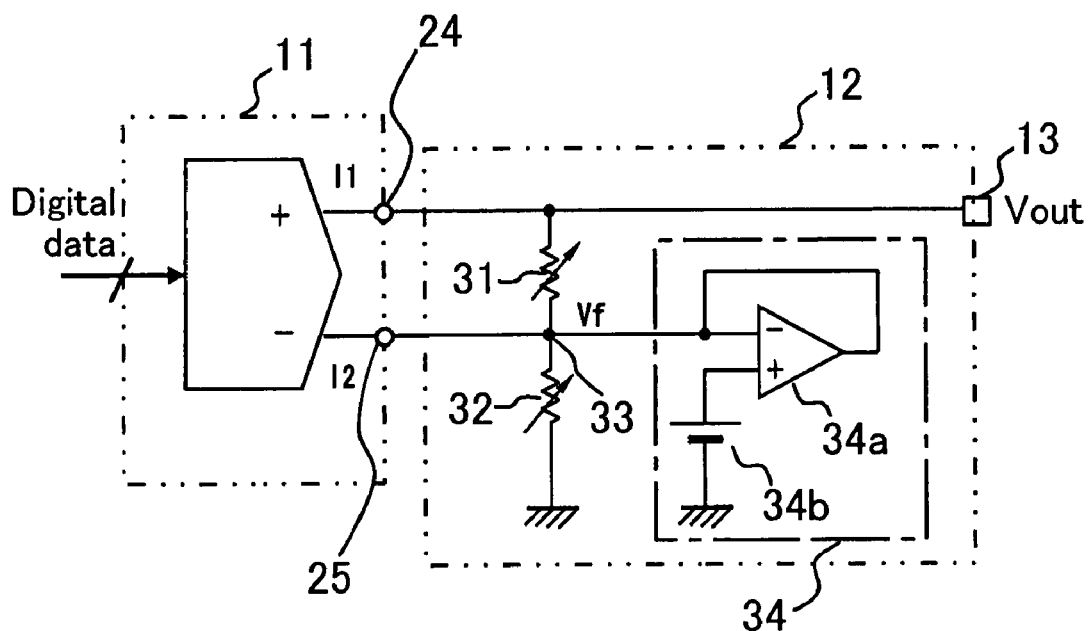
FIG. 6 is a circuit diagram showing a modification of the digital analog converter according to the one embodiment of the present invention.
Figure 7:
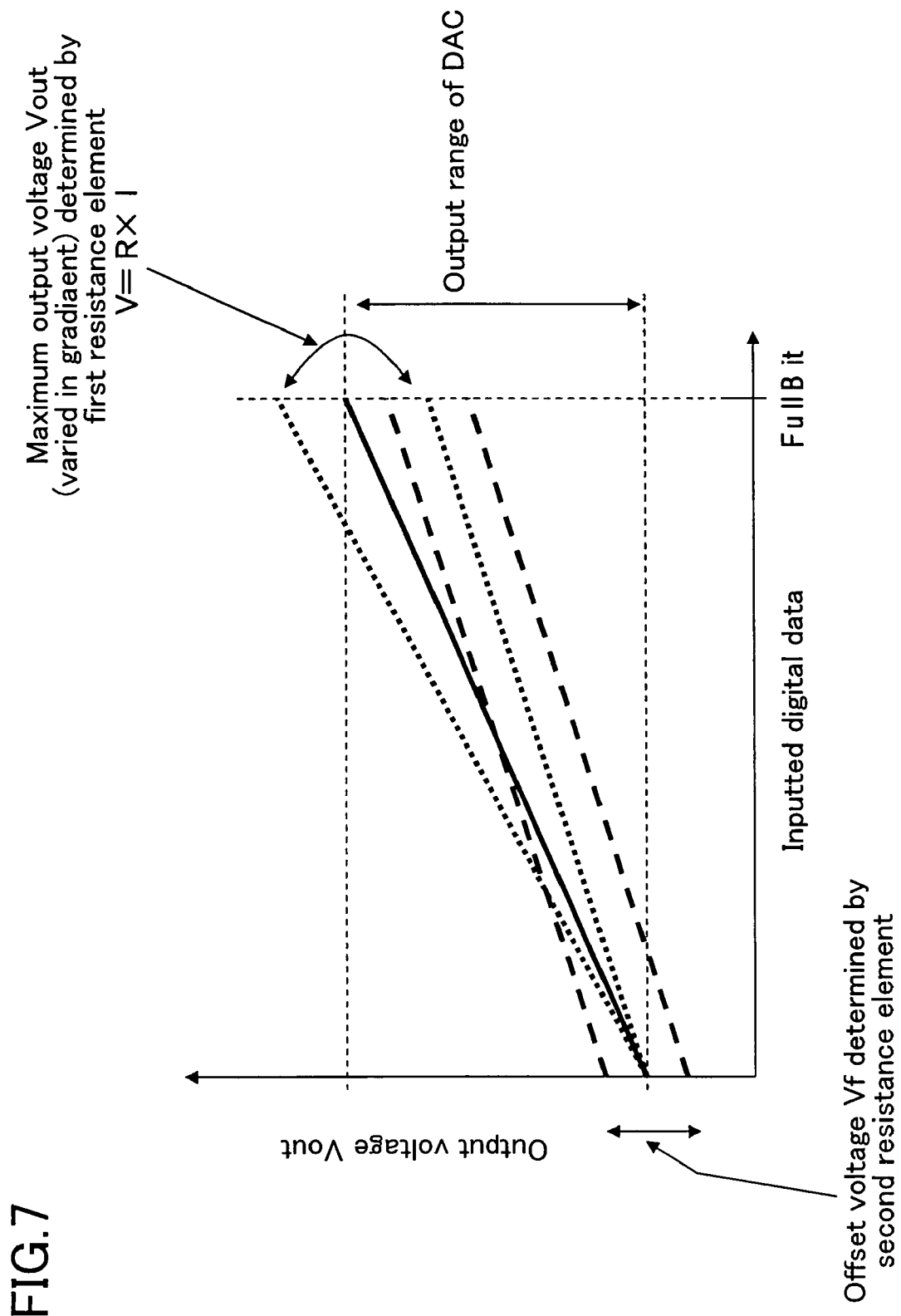
FIG. 7 is a graph showing an effect of a variable resistance according to the one embodiment of the present invention.
Figure 8:
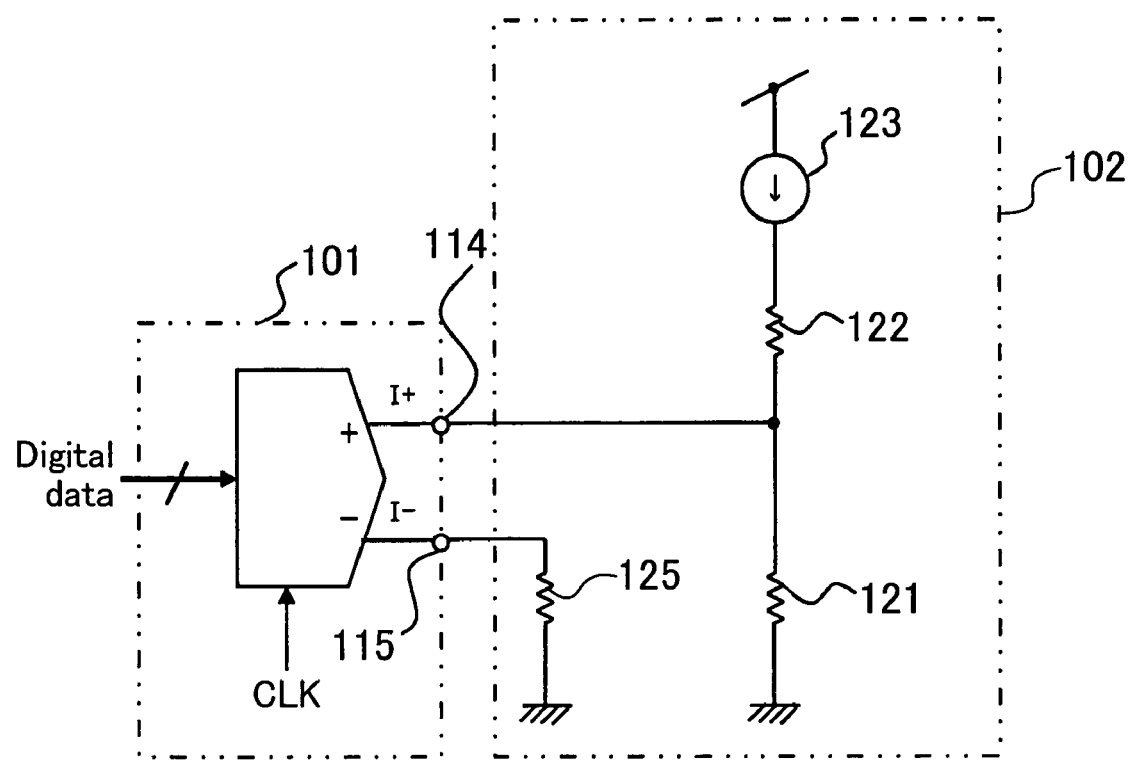
FIG. 8 is a circuit diagram showing a digital analog converter according to a related art.

Moreover, as shown in FIG. 6, the first resistance element 31 and the second resistance element 32 may be variable resistance elements. With this, as shown in FIG. 7, the ranges of the offset voltage Vf and the first voltage V1 can be made variable. With this, the range of the output voltage can be finely adjusted. Moreover, this can also respond to a case where the subsequent circuit has a plurality of modes and where the ranges of the required output voltage are different according to the modes. In this case, it is also possible to employ a configuration in which a plurality of resistance elements are switched for use.

In this regard, there has been described an example in which the subsequent circuit is the sample holding circuit.

However, the subsequent circuit is not limited to the sample holding circuit but may be an amplifier circuit or a comparator circuit.

As described above, the current addition type digital analog converter according to the present invention can realize a voltage output having a constant offset voltage added thereto without increasing the consumption current and the circuit footprint. For this reason, the current addition type digital analog converter according to the present invention is very useful, in particular, when a circuit requiring an offset voltage is connected as the subsequent circuit.

The description of the embodiments of the present invention is given above for the understanding of the present invention. It will be understood that the invention is not limited to the particular embodiments described herein, but is capable of various modifications, rearrangements, and substitutions as will now become apparent to those skilled in the art without departing from the scope of the invention. Therefore, it is intended that the following claims cover all such modifications and changes as fall within the true spirit and scope of the invention.

The invention claimed is:

1. A digital analog converter comprising:
a current conversion section having a first output terminal for outputting a first current and a second output terminal for outputting a second current, the first current varying in value according to inputted digital data, a sum of the first current and the second current being a constant current; and
a voltage conversion section for converting the first current to a corresponding first voltage and for producing an offset voltage on the basis of the constant current and outputs a sum of the first voltage and the offset voltage as an output voltage.

2. A digital analog converter comprising:
a current conversion section having a first output terminal for outputting a first current and a second output terminal for outputting a second current, the first current varying in value according to inputted digital data, a sum of the first current and the second current being a constant current; and
a voltage conversion section having a first resistance element and a second resistance element, the first resistance element being connected between the first output terminal and the second output terminal and producing a first voltage on the basis of the first current, the second resistance element being connected between the second output terminal and the ground and producing an offset voltage on the basis of the constant current.

3. The digital analog converter according to claim 2, wherein the voltage conversion section has a voltage holding circuit for holding a constant voltage at a connection node connecting the first resistance element and the second resistance element.

4. The digital analog converter according to claim 3, wherein the constant voltage is the offset voltage.

5. The digital analog converter according to claim 3, wherein the voltage holding circuit includes:
a differential amplifier having a minus side input terminal connected to the connection node and having an output terminal fed back to the minus side input terminal; and
a reference voltage source connected between a plus side input terminal of the differential amplifier and the ground.

6. The digital analog converter according to claim 5, wherein the reference voltage source is a band gap reference circuit.

7. The digital analog converter according to claim 5, wherein the reference voltage source is an external power source.

8. The digital analog converter according to claim 5, wherein a voltage of the reference voltage source is set on the basis of an input range of a circuit receiving the output voltage.

9. The digital analog converter according to claim 2, wherein at least one of the first resistance element and the second resistance element is a variable resistance element.

10. The digital analog converter according to claim 9, wherein a resistance value of the variable resistance element is set according to an input range of a circuit receiving the output voltage.

11. The digital analog converter according to claim 2, wherein the current conversion section includes a latch circuit holding the digital data in synchronization with a clock signal.

12. The digital analog converter according to claim 2, wherein a circuit receiving the output voltage is a sample holding circuit.

13. The digital analog converter according to claim 2, wherein a circuit receiving the output voltage is an amplifier circuit.

14. The digital analog converter according to claim 2, wherein a circuit receiving the output voltage is a comparator circuit.

* * * * *